(12) United States Patent
Balasingam et al.

(10) Patent No.: US 10,530,302 B2
(45) Date of Patent: Jan. 7, 2020

(54) CURRENT MODE CHOPPER AMPLIFIER

(71) Applicant: TEXAS INSTRUMENTS INCORPORATED, Dallas, TX (US)

(72) Inventors: Ravinthiran Balasingam, Tucson, AZ (US); Dimitar Trifonov, Vail, AZ (US); Biraja Prasad Dash, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/042,436

(22) Filed: Jul. 23, 2018

(65) Prior Publication Data

US 2019/0158026 A1    May 23, 2019

Related U.S. Application Data

(60) Provisional application No. 62/589,120, filed on Nov. 21, 2017.

(51) Int. Cl.
*H03F 3/45* (2006.01)
*H03F 1/02* (2006.01)

(52) U.S. Cl.
CPC ....... *H03F 1/0205* (2013.01); *H03F 3/45179* (2013.01); *H03F 2200/165* (2013.01); *H03F 2200/171* (2013.01)

(58) Field of Classification Search
CPC .............................. H03F 3/45; H03F 3/45892
USPC ....................................................... 330/9, 253
See application file for complete search history.

(56) References Cited

U.S. PATENT DOCUMENTS

| | | | | |
|---|---|---|---|---|
| 6,456,159 B1 * | 9/2002 | Brewer | ................... | H03F 3/393 327/124 |
| 7,292,095 B2 | 11/2007 | Burt et al. | | |
| 7,504,882 B2 * | 3/2009 | Saito | ..................... | G11C 7/067 330/253 |
| 7,554,389 B2 * | 6/2009 | Tsuchi | ..................... | H03F 1/26 330/253 |
| 7,733,169 B2 * | 6/2010 | Zhang | ..................... | H03F 3/005 330/124 R |

* cited by examiner

*Primary Examiner* — Henry Choe
(74) *Attorney, Agent, or Firm* — John R. Pessetto; Charles A. Brill; Frank D. Cimino (57) ABSTRACT

A circuit, comprising an input chopper configured to receive an input signal, a differential amplifier having an input coupled to an output of the input chopper, a current mode chopping circuit coupled to an output of the differential amplifier, and a first current mirror bias transistor pair coupled between a voltage supply and the current mode chopping circuit.

15 Claims, 4 Drawing Sheets

CURRENT MODE CHOPPER AMPLIFIER

CROSS-REFERENCE TO RELATED APPLICATIONS

The present application claims priority to U.S. Provisional Patent Application No. 62/589,120, which was filed Nov. 21, 2017, is titled "Current Mode Chopping for Chopper Amplifier Output," and is hereby incorporated herein by reference in its entirety.

BACKGROUND

A chopper amplifier receives a direct current (DC) differential input signal and processes the differential input signal according to alternating current (AC) principles. To process the differential input signal according to AC principles, the chopper amplifier includes one or more chopper circuits that chop the differential input signal, or an amplified version of the differential input signal, to alternate couplings of a first node between a first node and a third node or fourth node and between a second node and the third node or fourth node.

SUMMARY

Aspects of the present disclosure provide for a circuit comprising a first p-type metal oxide semiconductor field effect transistor (PMOS), a second PMOS, a third PMOS, a fourth PMOS, a first n-type metal oxide semiconductor field effect transistor (NMOS), a second NMOS, a third NMOS, and a fourth NMOS. The first PMOS has a gate terminal configured to receive an inverse of a clock signal, a drain terminal coupled to a first node, and a source terminal coupled to a second node. The second PMOS has a gate terminal configured to receive the clock signal, a drain terminal coupled to a third node, and a source terminal coupled to the second node. The third PMOS has a gate terminal configured to receive the clock signal, a drain terminal coupled to the first node, and a source terminal coupled to a fourth node. The fourth PMOS has a gate terminal configured to receive the inverse of the clock signal, a drain terminal coupled to the third node, and a source terminal coupled to the fourth node. The first NMOS has a gate terminal configured to receive the clock signal, a drain terminal coupled to the first node, and a source terminal coupled to a fifth node. The second NMOS has a gate terminal configured to receive the inverse of the clock signal, a drain terminal coupled to the third node, and a source terminal coupled to the fifth node. The third NMOS has a gate terminal configured to receive the inverse of the clock signal, a drain terminal coupled to the first node, and a source terminal coupled to a sixth node. The fourth NMOS has a gate terminal configured to receive the clock signal, a drain terminal coupled to the third node, and a source terminal coupled to the sixth node.

Other aspects of the present disclosure provide for a circuit, comprising an input chopper configured to receive an input signal, a differential amplifier having an input coupled to an output of the input chopper, a current mode chopping circuit coupled to an output of the differential amplifier, and a first current mirror bias transistor pair coupled between a voltage supply and the current mode chopping circuit.

Other aspects of the present disclosure provide for a circuit, comprising a first stage comprising an input chopper circuit, a first amplifier, and a current mode chopper circuit, a second stage comprising a second amplifier, a third stage comprising a third amplifier, and a feed-forward path comprising a fourth amplifier.

BRIEF DESCRIPTION OF THE DRAWINGS

For a detailed description of various examples, reference will now be made to the accompanying drawings in which.

DETAILED DESCRIPTION

In some implementations of a chopper amplifier, accuracy of an output of the chopper amplifier (Vout) is at least partially dependent on an input voltage signal (Vin) offset, for example, by a direct current (DC) offset voltage. In at least some examples, Vin is a differential signal having positive and negative portions. When Vin has a small value, high-gain amplification may be desired. The high-gain amplification may introduce undesirable noise and offset to an output of the chopper amplifier when the chopper amplifier operates according to DC principles. To compensate for the potentially undesirable noise and offset, some examples of the chopper amplifier include chopper circuits (e.g., input and/or output chopper circuits) that chop Vin to enable the chopper amplifier to operate, at least partially, according to alternating current (AC) principles. In some examples of chopping via chopper circuit, undesirable effects may occur such as a reduction in gain of the chopper amplifier resulting from parasitic capacitance associated with the chopper circuits.

At least some aspects of the present disclosure provide for a current mode chopping circuit. The current mode chopping circuit is suitable for implementation, in at least one example, in a chopper amplifier. For example, the current mode chopping circuit is suitable for implementation as an output chopper in a first stage (e.g., gain first stage) in a multi-stage (e.g., three-stage) chopper amplifier. In at least some examples, the current mode chopping circuit is incorporated into an amplifier (e.g., an amplifier of a gain first stage of a chopper amplifier). In a first state, the current mode chopping circuit, in some examples, provides a current present in a first path and a current present in a second path to pass through a first node and a second node, respectively. In a second state, the current mode chopping circuit diverts this first path and the second path to a third path and fourth path, respectively, to pass through the second and first node respectively. Selection of operation in the first state or the second state (e.g., selecting which path is coupled to which node) in the current mode chopping circuit is, in at least some examples, controlled by a clock signal (CLK) specifying operation in the first state or the second state.

Figure 1:
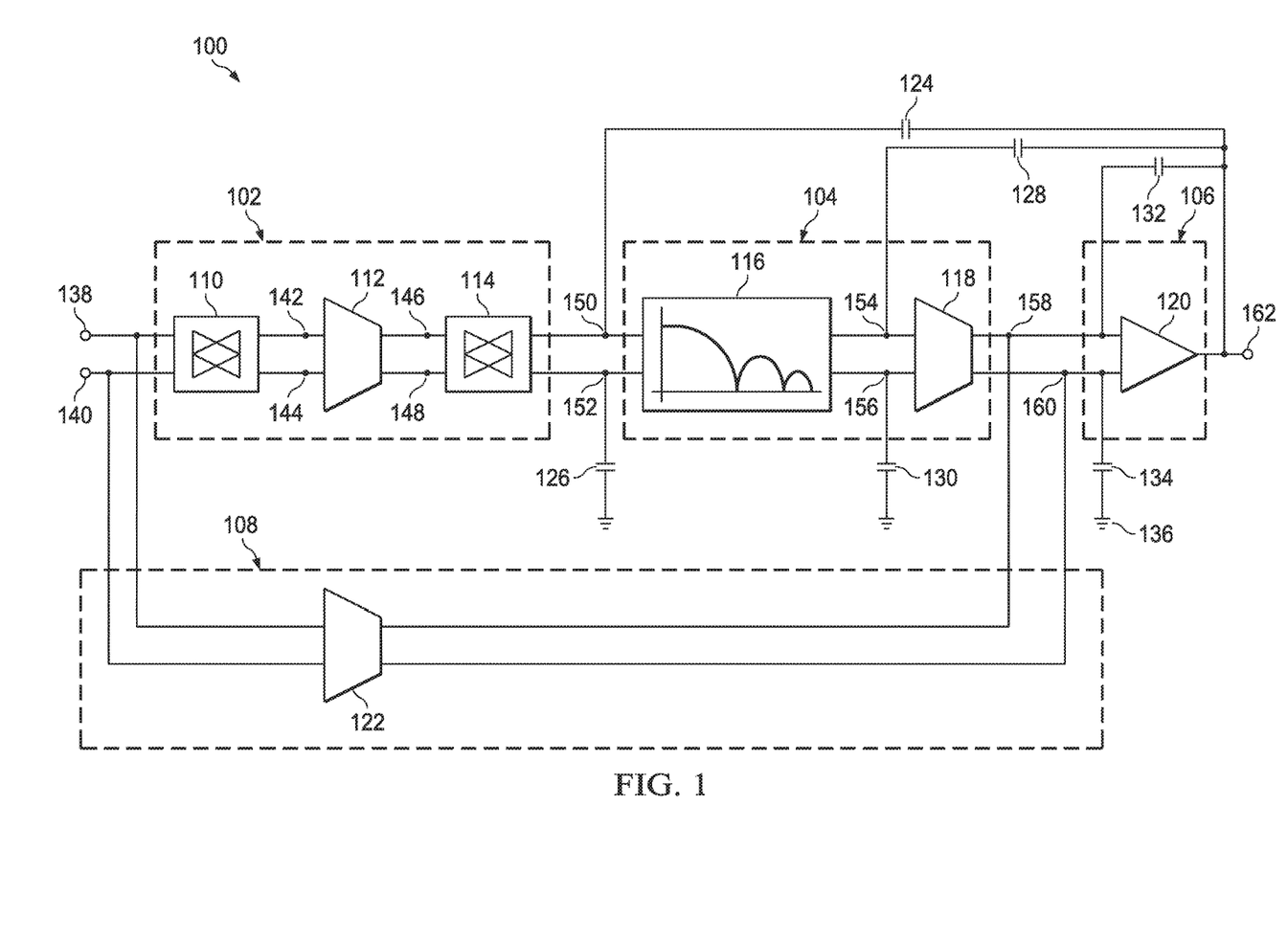
FIG. 1 shows a block diagram of an illustrative chopper amplifier in accordance with various embodiments.

Referring now to FIG. 1, a block diagram of an illustrative chopper amplifier 100 is shown. The chopper amplifier 100, in at least one example, includes a first stage 102, a second stage 104, a third stage 106, and a feed-forward path 108. The first stage 102 includes, for example, an input chopper switch 110, a first amplifier 112, and a current mode chopping circuit (e.g., an output chopper switch) 114. Although illustrated separately, in at least some examples, the first amplifier 112 and the current mode chopping circuit 114 are incorporated together into a single element. For example, the current mode chopping circuit 114 is implemented within the first amplifier 112. The second stage 104 includes, in some examples, a filter 116 and a second amplifier 118. In one example, the filter 116 is a notch filter (e.g., a band-stop filter that passes most frequencies substantially unaltered and attenuates frequencies in a specific frequency range). In other examples, the filter 116 is any other suitable form of filter (e.g., a low-pass filter, a hi-pass filter, a band-pass filter, and/or any combination of multiple filters coupled together). The third stage 106 includes, in some examples, a third amplifier 120. The feed-forward path 108 includes, in some examples, a fourth amplifier 122. In at least some examples, the feed-forward path 108 includes one or more additional components, such as one or more components arranged and/or configured to reduce noise or ripple in a signal present in, or output by, the chopper amplifier 100, or any other suitable purpose determined according to an architecture of the chopper amplifier 100. In at least some examples, the chopper amplifier 100 further includes one or more additional components such as resistors, capacitors, and/or other components configured to interact with, or be included in, any one or more of the first stage 102, second stage 104, or third stage 106. For example, the chopper amplifier 100, in at least one architecture, includes capacitor 124 coupled between a node 162 and a node 150, capacitor 126 coupled between a node 152 and a ground node 136, capacitor 128 coupled between a node 154 and node 162, capacitor 130 coupled between a node 156 and the ground node 136, capacitor 132 coupled between a node 158 and node 162, and a capacitor 134 coupled between a node 160 and the ground node 136. Capacitance values of the capacitors 124, 126, 128, 130, 132, and 134, in at least one example, at least partially control an amount of gain provided by one or more of the first amplifier 112, the second amplifier 118, and/or the third amplifier 120. In various examples, the first amplifier 112, second amplifier 118, third amplifier 120, and/or fourth amplifier 122 are implemented using any suitable technique and have any suitable architecture or topology capable of performing amplification, a scope of which is not limited herein. In at least one example, the first amplifier 112, second amplifier 118, and fourth amplifier 122 are each operational transconductance amplifiers having differential inputs and differential outputs and the third amplifier 120 is an operational transconductance amplifier having a differential input and a single output (e.g., such as to drive large value load), however the first amplifier 112, second amplifier 118, third amplifier 120, and/or fourth amplifier 122 are not limited to these specific architectures. In some examples, the first amplifier 112, second amplifier 118, third amplifier 120, and/or fourth amplifier 122 include further couplings not shown in FIG. 1, such as coupled to one or more voltage supplies and/or current supplies (e.g., to bias one or more of the first amplifier 112, second amplifier 118, third amplifier 120, and/or fourth amplifier 122), the ground node 136, or any other suitable coupling point based on a principle of operation of the first amplifier 112, second amplifier 118, third amplifier 120, and/or fourth amplifier 122, a scope of which is not limited herein.

In at least one example of operation, the chopper amplifier 100 receives a differential input signal at nodes 138 and 140. For example, a positive (or first) component of the differential input signal is received at node 138 and a negative (or second) component of the differential input signal is received at node 140. The differential input signal is provided (e.g., substantially simultaneously) to both the first stage 102 and the feed-forward path 108. In at least some examples, the input chopper switch 110 is a clocked component configured to receive CLK (not shown) and operate at a frequency of CLK (e.g., a chopping frequency). The input chopper switch 110 is further configured to chop the differential input signal and provide the chopped differential input signal to the first amplifier 112. For example, for a first clock cycle (e.g., when CLK is a high value), the input chopper switch 110 passes the positive component of the differential input signal from the node 138 to the node 142 and passes the negative component of the differential input signal from the node 140 to the node 144. At a second clock cycle (e.g., when CLK is a low value), the input chopper switch 110 passes the positive component of the differential input signal from the node 138 to the node to the node 144 and passes the negative component of the differential input signal from the node 140 to the node 142. The input chopper switch 110 passes the positive component of the differential input signal from the node 138 to the node 142, for example, by coupling the node 138 to the node 142 (after decoupling the node 138 from the node 144 if the node 138 was previously coupled to the node 144) and passes the positive component of the differential input signal from the node 138 to the node 144 by decoupling the node 138 from the node 142 and coupling the node 138 to the node 144. Similarly, the input chopper switch 110 passes the negative component of the differential input signal from the node 140 to the node 144, for example, by coupling the node 140 to the node 144 (after decoupling the node 140 from the node 142 if the node 140 was previously coupled to the node 142) and passes the negative component of the differential input signal from the node 140 to the node 142 by decoupling the node 140 from the node 144 and coupling the node 140 to the node 142. Such action of alternating couplings of node 138 to node 142 or node 144, and of node 140 to node 144 or node 142, is, in some examples, referred to as chopping (e.g., chopping the differential input signal received at nodes 138 and 140). In at least one example, chopping of the differential input signal facilitates processing of a DC signal in a manner substantially similar to alternating current (AC) signal processing.

The first amplifier 112 receives the chopped differential signal at nodes 142 and 144 and amplifies the chopped differential signal, providing an amplified differential signal at nodes 146 and 148, respectively. The current mode chopping circuit 114, in at least one example, couples the amplified differential signal present at node 146 to node 150 during a first clock cycle and node 152 during a second clock cycle and couples the amplified differential signal present at node 148 to node 152 during the first clock cycle and node 150 during the second clock cycle. In at least one example, the current mode chopping circuit 114 couples the amplified differential signal based on current mode switching (sometimes also referred to as current mode chopping) from nodes 146 and 148 to nodes 150 and 152. Current mode switching provides for maintaining a voltage path through the current mode chopping circuit 114 and switching a current path to couple the amplified differential signal present at node 146 to node 150 during the first clock cycle and node 152 during the second clock cycle and couple the amplified differential signal present at node 148 to node 152 during the first clock cycle and node 150 during the second clock cycle. In at least some examples, performing the current mode switching as opposed to other forms of switching such as voltage switching or current mirror switching increases gain of the first stage 102 and/or reduces an input referred offset voltage and associated noise at the input (e.g., nodes 138 and 140) of the first stage 102. Accordingly, in at least some examples, the current mode switching further improves efficiency (e.g., enables a higher achievable signal gain at previously used current levels that did not support the higher signal gain) and amplification characteristics (e.g., such as low input offset and noise) of the first stage 102 and chopper amplifier 100.

In at least some examples, the differential signal present at nodes 150 and 152 is filtered by the filter 116 to provide a filtered differential signal at nodes 154 and 156, respectively. The differential signal is filtered, for example, to remove a voltage ripple in the differential signal. In at least some examples, such as when a bandwidth of the chopper amplifier 100 is less than the chopping frequency, a voltage ripple is introduced into the differential signal, such as by the chopping of the input chopper switch 110 and/or the current mode chopping circuit 114. The voltage ripple, in some examples, exists at a frequency at, or near, the chopping frequency. To at least partially mitigate the voltage ripple, the filter 116 filters the differential signal present at nodes 150 and 152 prior to providing the filtered differential signal at nodes 154 and 156, respectively. Such filtering, in at least one example, improves accuracy and efficiency of the chopper amplifier 100.

The filtered differential signal present at nodes 154 and 156 is further amplified by the third amplifier 118 and provided to the nodes 158 and 160, respectively. Returning to the feed-forward path 108, the fourth amplifier 122 receives the differential input signal at nodes 138 and 140, amplifies the differential input signal, and provides the amplified differential input signal to node 158 and 160, respectively. In at least some examples, the feed-forward path 108 is referred to as a high-frequency path (e.g., having a wide signal bandwidth) and a path formed by the first stage 102 and the second stage 104 is referred to as a low-frequency path (e.g., having a narrow signal bandwidth). In at least one example, the amplified differential input signal provided by the feed-forward path 108 and fourth amplifier 122 to nodes 158 and 160 includes an offset from the differential input signal present at nodes 138 and 140, amplified by the fourth amplifier 122. In at least some examples, the amplified differential signal provided by the second amplifier 118 to nodes 158 and 160 compensates at nodes 158 and 160 for the amplified offset in the amplified differential input provided by the feed-forward path 108 and fourth amplifier 122 to the nodes 158 and 160. In at least some examples, the third amplifier 120 amplifies the signal present at nodes 158 and 160 (e.g., the amplified differential input provided by the feed-forward path 108 and fourth amplifier 122 combined with the amplified differential signal provided by the second amplifier 118) to provide Vout (e.g., an output of the chopper amplifier 100) at node 162.

In at least some examples, certain characteristics of any one or more of the first stage 102, second stage 104, third stage 106, and/or feed-forward stage 108 effect Vout. For example, characteristics of the first stage 102, such as characteristics of the current mode chopping circuit 114, in some circumstances affect Vout. As one example, capacitance of the current mode chopping circuit 114 and gain of the first stage 102 have an inverse relationship such that when capacitance of the current mode chopping circuit 114 increases, gain of the first stage 102 decreases. In some examples, this decrease in gain of the first stage 102 inhibits the ability of the first stage 102 and second stage 104 to provide the amplified differential signal to nodes 158 and 160 having a value sufficient to compensate at nodes 158 and 160 for the amplified offset in the amplified differential input provided by the feed-forward path 108 and fourth amplifier 122. To at least partially control capacitance of the current mode chopping circuit 114 and mitigate reduction in gain of the first stage 102, in at least some example the current mode chopping circuit 114 chops the amplified differential signal received from the first amplifier 112 according to current mode switching, as discussed above and discussed in greater detail below.

Figure 2A:
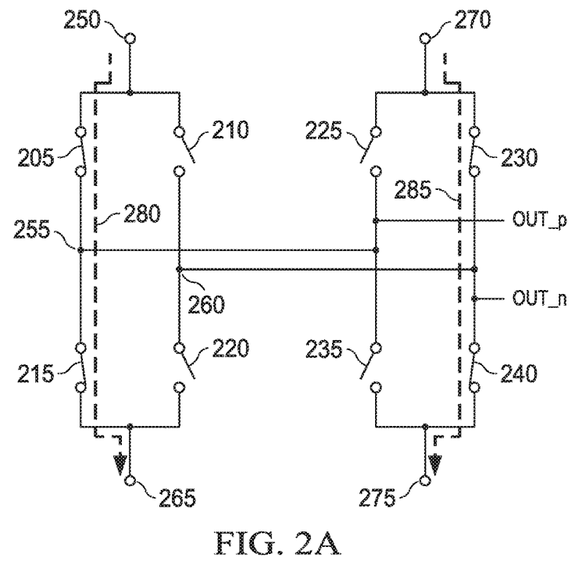
FIG. 2A shows a block diagram of an illustrative circuit in accordance with various embodiments.
Figure 2B:
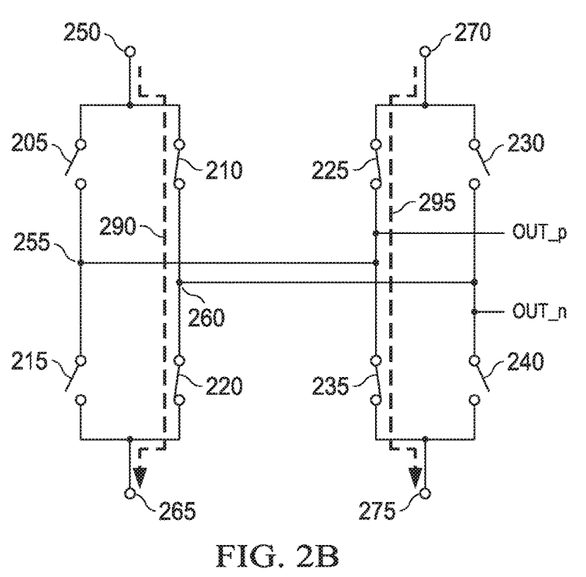
FIG. 2B shows a block diagram of an illustrative circuit in accordance with various embodiments.

Referring now to FIGS. 2A and 2B, block diagrams of an illustrative circuit 200 are shown. In at least one example, the circuit 200 is suitable for implementation as the current mode chopping circuit 114, discussed above with respect to FIG. 1. In other examples, the circuit 200 is suitable for implementation in circuit type or architecture. In at least one example, the circuit 200 is representative of a current mode chopping circuit. FIG. 2A illustrates the circuit 200 during a first clock cycle (e.g., when CLK has a high value). FIG. 2B illustrates the circuit 200 during a second clock cycle (e.g., when CLK has a low value). As discussed in the present disclosure, when CLK has a high value, it is understood that the inverse of CLK (nCLK) has a low value. Similarly, when CLK has a low value, it is understood that nCLK has a high value. In at least some examples, nCLK is formed as a separate signal by inverting CLK (e.g., via a logical inverter).

In at least one example, the circuit 200 includes switches 205, 210, 215, 220, 225, 230, 235, and 240 (switches 205-240). In various examples, each of the switches 205-240 takes any suitable form such as a transistor (metal oxide semiconductor field effect transistor (MOSFET) or bi-polar junction transistor (BJT)), a mechanical switch or relay, and/or any other form of controllable switch or switching mechanism. Additionally, in various examples, the switches 205-240 include any combination of the foregoing component types such that, in some examples, the switches 205-240 are not each the same component type, while in other examples, the switches 205-240 are the same component type (e.g., such as each of the switches 205-240 being a MOSFET).

In at least one example architecture, the switch 205 has a first terminal coupled to a node 250 and a second terminal coupled to a node 255 and the switch 210 has a first terminal coupled to the node 250 and a second terminal coupled to a node 260. The switch 215 has a first terminal coupled to the node 255 and a second terminal coupled to a node 265 and the switch 220 has a first terminal coupled to the node 260 and a second terminal coupled to the node 265. The switch 225 has a first terminal coupled to a node 270 and a second terminal coupled to the node 255 and the switch 230 has a first terminal coupled to the node 270 and a second terminal coupled to the node 260. The switch 235 has a first terminal coupled to the node 255 and a second terminal coupled to a node 275 and the switch 240 has a first terminal coupled to the node 260 and a second terminal coupled to the node 275. In at least one example, each of the switches 210, 215, 225, and 240 is configured to receive and/or be controlled by CLK such that each of the switches 215 and 240 conduct between their respective first and second terminals when CLK has a high value and switches 210 and 225 conduct between their respective first and second terminals when CLK has a low value. In at least one example, each of the switches 205, 220, 230, and 235 is configured to receive and/or be controlled by nCLK such that each of the switches 205 and 230 conduct between their respective first and second terminals when nCLK has a low value and the switches 220 and 235 conduct between their respective first and second terminals when nCLK has a high value. In at least one example, nodes 250, 265, 270, and 275 function as inputs of the circuit 200 and nodes 255 and 260 function as outputs of the circuit 200. For example, the node 250 is a high-side positive input of a differential input signal, node 265 is a low-side positive input of the differential input signal, node 270 is a high-side negative input of the differential input signal, node 275 is a low-side negative input of a differential input signal, node 255 is a positive output (Out_p) of a differential output signal and node 260 is a negative output (Out_n) of the differential output signal.

In one example of operation of the circuit 200, when CLK has a high value and nCLK has a low value the switches 210, 220, 225, and 235 are open, blocking current flow between their respective first and second terminals, as shown in FIG. 2A. As further shown in FIG. 2A, when CLK has a high value and nCLK has a low value the switches 205, 215, 230, and 240 are closed, facilitating current flow between their respective first and second terminals and creating a path 280 from node 250 to node 265 and a path 285 from node 270 to node 275. The path 280 couples the node 250 to the node 265 via the node 255 for output (e.g., as Out_p) and the path 285 couples the node 270 to the node 275 via the node 260 for output (e.g., as Out_n).

In another example of operation of the circuit 200, when CLK has a low value and nCLK has a high value the switches 205, 215, 230, and 240 are open, blocking current flow between their respective first and second terminals, as shown in FIG. 2B. As further shown in FIG. 2B, when CLK has a low value and nCLK has a high value the switches 210, 220, 225, and 235 are closed, facilitating current flow between their respective first and second terminals and creating a path 290 from node 250 to node 265 and a path 295 from node 270 to node 275. The path 290 couples the node 250 to the node 265 via the node 260 for output (e.g., as Out_n) and the path 295 couples the node 270 to the node 275 via to the node 255 for output (e.g., as Out_p)

Figure 3:
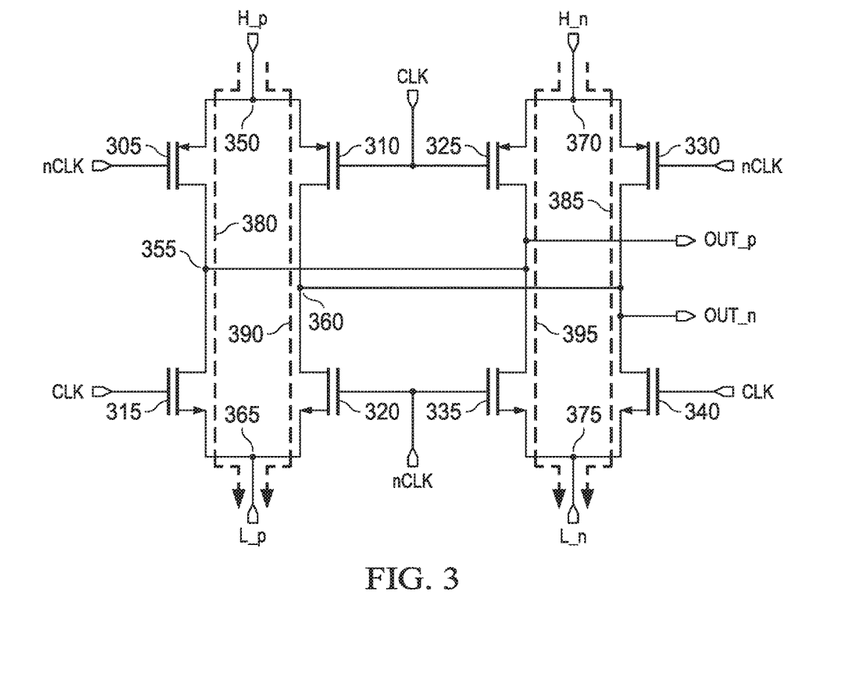
FIG. 3 shows a schematic diagram of an illustrative circuit in accordance with various embodiments.

Referring now to FIG. 3, a schematic diagram of an illustrative circuit 300 is shown. In at least some examples, the circuit 300 is a current mode chopping circuit. Further, in at least one example, the circuit 300 is a transistor-level implementation of the circuit 200, discussed above with respect to FIG. 2, and is suitable for implementation as the current mode chopping circuit 114, discussed above with respect to FIG. 1. In one example, the circuit 300 includes a plurality of p-type MOSFETs (PMOS) and a plurality of n-type MOSFETs (NMOS). For example, the circuit 300 includes PMOS 305, PMOS 310, PMOS 325, and PMOS 330, as well as NMOS 315, NMOS 320, NMOS 335, and NMOS 340. In at least one examples, the PMOS 305, PMOS 310, PMOS 325, PMOS 330, NMOS 315, NMOS 320, NMOS 335, and NMOS 340 correspond to the switches 205, 210, 225, 230, 215, 220, 235, and 240, respectively, of FIGS. 2A and 2B. In at least some examples, the circuit 300 further includes nodes 350, 355, 360, 365, 370, and 375 and correspond to the nodes 250, 255, 260, 265, 270, and 275, respectively, of FIGS. 2A and 2B.

In at least one example architecture, the PMOS 305 has a drain terminal coupled to the node 355, a source terminal coupled to the node 350, and a gate terminal configured to receive an inverse of the CLK signal. The PMOS 310 has a drain terminal coupled to the node 360, a source terminal coupled to the node 350, and a gate terminal configured to receive the CLK signal. The NMOS 315 has a drain terminal coupled to the node 355, a source terminal coupled to the node 365, and a gate terminal configured to receive the CLK signal. The NMOS 320 has a drain terminal coupled to the node 360, a source terminal coupled to the node 365, and a gate terminal configured to receive the inverse of the CLK signal. The PMOS 325 has a drain terminal coupled to the node 355, a source terminal coupled to the node 370, and a gate terminal configured to receive the CLK signal. The PMOS 330 has a drain terminal coupled to the node 360, a source terminal coupled to the node 370, and a gate terminal configured to receive the inverse of the CLK signal. The NMOS 335 has a drain terminal coupled to the node 355, a source terminal coupled to the node 375, and a gate terminal configured to receive the inverse of the CLK signal. The NMOS 340 has a drain terminal coupled to the node 360, a source terminal coupled to the node 375, and a gate terminal configured to receive the CLK signal.

In at least one example, nodes 350, 365, 370, and 375 function as inputs of the circuit 300 and nodes 355 and 360 function as outputs of the circuit 300. For example, the node 350 is a high-side positive input of a differential input signal, node 365 is a low-side positive input of the differential input signal, node 370 is a high-side negative input of the differential input signal, node 375 is a low-side negative input of a differential input signal, node 355 is a positive output of a differential output signal and node 360 is a negative output of the differential output signal.

In one example of operation of the circuit 300, when CLK has a high value and nCLK has a low value the PMOS 305, NMOS 315, PMOS 330, and NMOS 340 conduct current between their respective source and terminals, creating a path 380 from node 350 to node 365 and a path 385 from node 370 to node 375. The path 380 couples the node 350 to the node 365 via the node 355 for output and the path 385 couples the node 370 to the node 375 via the node 360 for output. Further, when CLK has a high value and nCLK has a low value, the PMOS 310, NMOS 320, PMOS 325, and NMOS 335 do not conduct current between their respective source and terminals. In the context of FIG. 3, a high value of CLK or nCLK describes a value sufficiently large as to cause an NMOS to form a channel between source and drain terminals through which electrons flow to provide conductivity between the source and drain terminals of the NMOS. Similarly, in the context of FIG. 3, a low value of CLK or nCLK describes a value sufficiently small as to cause a PMOS to form a channel between source and drain terminals through which electrons flow to provide conductivity between the source and drain terminals of the PMOS. A low value of CLK or nCLK is insufficient to cause the NMOS to form a channel between source and drain terminals and a high value of CLK or nCLK, is insufficient to cause the PMOS to form a channel between source and drain terminals.

In another example of operation of the circuit 300, when CLK has a low value and nCLK has a high value the PMOS 310, NMOS 320, PMOS 325, and NMOS 335 conduct current between their respective source and terminals, creating a path 390 from node 350 to node 365 and a path 395 from node 370 to node 375. The path 390 couples the node 350 to the node 365 via the node 360 for output and the path 395 couples the node 370 to the node 375 via the node 355 for output. Further, when CLK has a low value and nCLK has a high value, PMOS 305, NMOS 315, PMOS 330, and NMOS 340 do not conduct current between their respective source and terminals.

Figure 4:
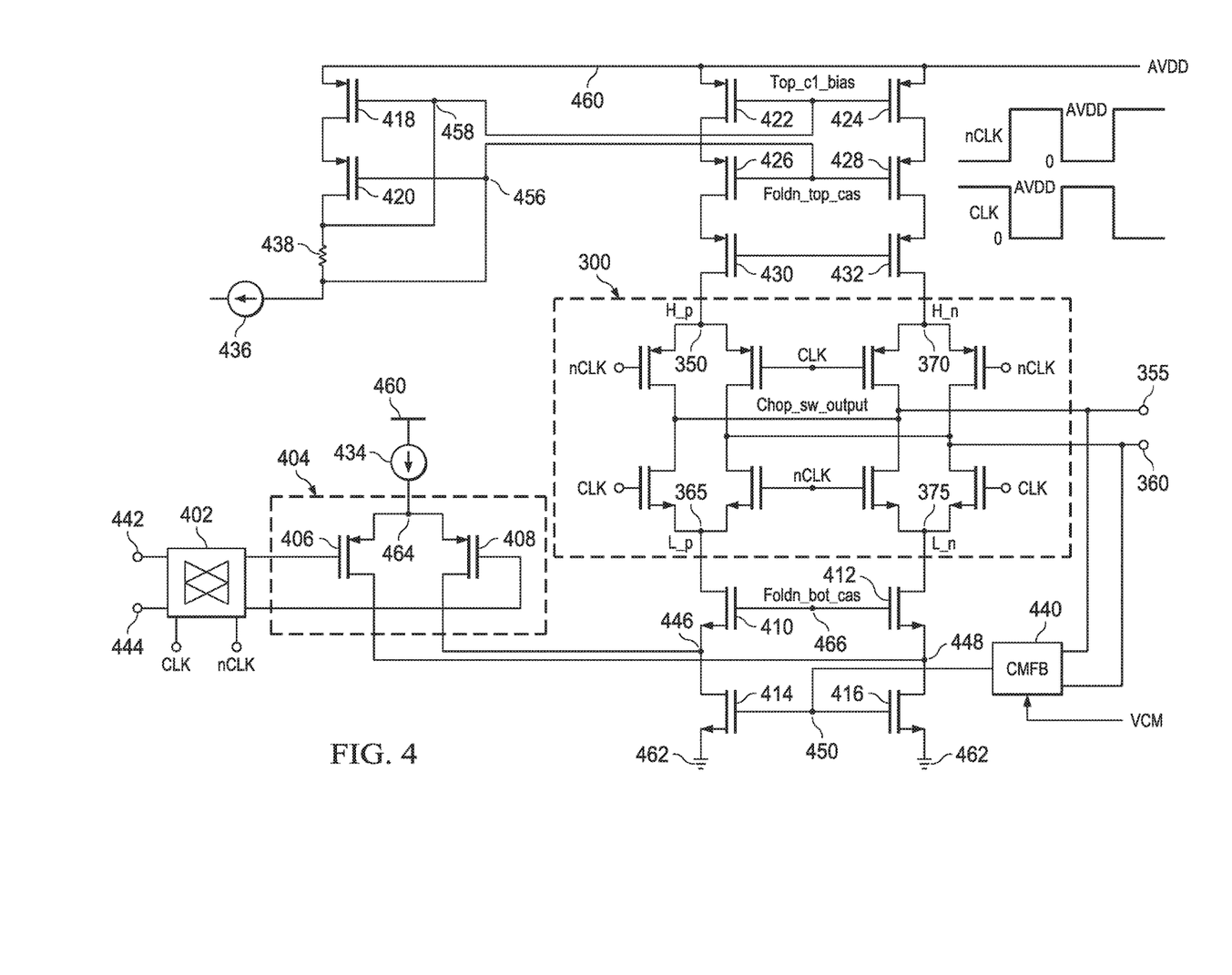
FIG. 4 shows a schematic diagram of an illustrative circuit in accordance with various embodiments.

Referring now to FIG. 4, a schematic diagram of an illustrative circuit 400 is shown. In at least some examples, the circuit 400 is a front stage of a chopper amplifier including input chopping, a differential amplifier, and output chopping. In some examples, the circuit 400 is suitable for implementation as the first stage 102 of the chopper amplifier 100 of FIG. 1, as described above. In some example, the circuit 400 includes, or implements at least the circuit 300 of FIG. 3. In one example, the circuit 400 includes an input chopper 402, a differential amplifier 404 comprising a PMOS 406 and a PMOS 408, a plurality of NMOS 410, 412, 414, and 416, a plurality of PMOS 418, 420, 422, 424, 426, 428, 430, and 432, and is configured to couple to current sources 434 and 436, as well as a resistor 438. In at least some examples, the circuit 400 further includes, or is configured to couple to, a common-mode feedback circuit 440. In at least one example, node 460 is, or is coupled to, a voltage supply and node 462 is, or is coupled to, a ground voltage potential.

In at least one example architecture, the node 442 is configured to receive a positive component of a differential input signal and node 444 is configured to receive a negative component of a differential input signal. The input chopper 402 has a first input coupled to the node 442 and a second input coupled to the node 444. The PMOS 406 has a gate terminal coupled to a first output of the input chopper 402, a drain terminal coupled to a node 448, and a source terminal coupled to a node 464. The PMOS 408 has a gate terminal coupled to a second output of the input chopper 402, a drain terminal coupled to a node 446, and a source terminal coupled to the node 464. The NMOS 410 has a gate terminal coupled to a gate terminal of the NMOS 412, a drain terminal coupled to the node 365, and a source terminal coupled to the node 446. The NMOS 412 has a gate terminal coupled to the gate terminal of the NMOS 410, a drain terminal coupled to the node 375, and a source terminal coupled to the node 448. The NMOS 414 has a gate terminal coupled to a node 450, a drain terminal coupled to the node 446, and a source terminal coupled to the node 462. The NMOS 416 has a gate terminal coupled to the node 450, a drain terminal coupled to the node 448, and a source terminal coupled to the node 462. In some examples, a common gate node voltage of NMOS 410 and NMOS 412 is externally set (e.g., and received at node 466) by any suitable component to adjust drain voltages of the NMOS 414 and the NMOS 416 at nodes 446 and 448, respectively.

Continuing with the example architecture, the PMOS 418 has a gate terminal coupled to a node 458, a drain terminal coupled to a source terminal of the PMOS 420, and a source terminal coupled to the node 460. The PMOS 420 has a gate terminal coupled to a node 456, a drain terminal coupled to a node 458, and a source terminal coupled to the drain terminal of the PMOS 418. The PMOS 422 has a gate terminal coupled to the node 458, a drain terminal coupled to a source terminal of the PMOS 426, and a source terminal coupled to the node 460. The PMOS 424 has a gate terminal coupled to the node 458, a drain terminal coupled to a source terminal of the PMOS 428, and a source terminal coupled to the node 460. The PMOS 426 has a gate terminal coupled to the node 456, a drain terminal coupled to a source terminal of the PMOS 430, and a source terminal coupled to the drain terminal of the PMOS 422. The PMOS 428 has a gate terminal coupled to the node 456, a drain terminal coupled to a source terminal of the PMOS 432, and a source terminal coupled to the drain terminal of the PMOS 424. The PMOS 430 has a gate terminal coupled to a gate terminal of the PMOS 432, a drain terminal coupled to the node 350, and a source terminal coupled to the drain terminal of the PMOS 426. The PMOS 432 has a gate terminal coupled to the gate terminal of the PMOS 430, a drain terminal coupled to the node 370, and a source terminal coupled to the drain terminal of the PMOS 428. In at least some examples, the PMOS 426 and PMOS 428 together form a first bias cascode transistor pair and the PMOS 430 and PMOS 432 together form a second bias cascode transistor pair for the current mirror bias transistor pair formed by PMOS 422 and PMOS 424. The current source 434 is configured to couple between the node 460 and the node 464 to provide a tail current for PMOS 406 and PMOS 408 (e.g., where the PMOS 406 and PMOS 408 form a input differential pair). The current source 436 is configured to couple to the node 456 and draw a bias current through PMOS 418, PMOS 420, and resistor 438 from node 460. The resistor 438 is configured to couple between nodes 456 and 458 to provide to bias nodes 456 and 458 such that nodes 456 and 458 mirror a current flowing through PMOS 418 into PMOS 422 and PMOS 424. In some examples, the current is provided by setting a gate voltage of the PMOS 422 and the PMOS 424 to be substantially the same as a gate voltage of the PMOS 418. Drain voltages of the PMOS 422, PMOS 424, and PMOS 418 are maintained below the saturation voltage of each respective PMOS by providing voltages at node 456 and node 458 varied based on the amount of resistance of the resistor 438 and a value of an output of the current source 436. In at least one example, an external gate voltage of Vcm (not shown) is provided to gate terminals of PMOS 430 and PMOS 432 to maintain these devices in saturation mode such that PMOS 422 and PMOS 424 drain currents flow through drain terminals of the PMOS 430 and the PMOS 432. In some examples, the currents flowing through the drain terminals of the PMOS 430 and the PMOS 432 are substantially equal to, or some multiple of, the value of the output of the current source 436 which flows through the resistor 438 and PMOS 420 into PMOS 418. In some examples, this current is further mirrored by PMOS 422 and PMOS 424. The common-mode feedback circuit 440 is configured to couple at a first input to the node 355, at a second input to the node 360, and at an output to the node 450. In at least one example, the common-mode feedback circuit 440 receives a common mode voltage signal (VCM) and maintains an average of an output signal present at node 355 and node 360 at a value of VCM. In at least some examples, the input chopper 402 and circuit 300 are configured to receive CLK and nCLK to chop the inputs and outputs substantially synchronously, as further discussed herein.

In at least one example of operation, when a positive differential input is present between node 442 and node 444, the input chopper circuit 402 chops the positive differential input such that gate terminals of the PMOS 406 and the PMOS 408 receive a positive portion of the differential input in a first phase cycle (e.g., clock cycle) and negative differential input in a second phase cycle (e.g., clock cycle). For example, during the first phase cycle, the input chopper circuit 402 couples node 442 to the gate terminal of the PMOS 406 and node 444 to the gate terminal of the PMOS 408. During the second phase cycle, the input chopper circuit couples the node 442 to the gate terminal of the PMOS 408 and couples the node 444 to the gate terminal of the PMOS 406. Additionally, during the first phase cycle, a voltage present at node 442 is higher than a voltage present at node 444 (e.g., because the differential input is a positive differential input). Accordingly, when CLK is a high value and nCLK is a low value, a value of the gate voltage of the PMOS 406 is greater than a value of the gate voltage of the PMOS 408, thereby causing a greater portion of a bias tail current to flow through PMOS 408 from current source 434 than the portion of the bias tail current flowing through PMOS 406. This greater proportion of the bias tail current flowing through PMOS 408 and lesser proportion of PMOS 406 creates an imbalanced condition at node 446 and node 448. The greater proportion of the bias tail current flowing through the PMOS 408 and lesser proportion of the bias tail current flowing through the PMOS 406 current forces a voltage present at the node 448 to move lower and a voltage present at the node 446 to move higher. In this first phase cycle, with CLK having a high value and nCLK having a low value, current path 380 and current path 385, shown in FIG. 3, facilitate the flow of the current flowing through the PMOS 430 from node 350 and to node 365 through node 355 and the flow of the current flowing through the PMOS 432 from the node 370 and to the node 375 through the node 360. The current flowing through the path 380 flows through the NMOS 410 to the NMOS 414 and the ground node 462. Similarly, the current flowing through the path 385 flows through the NMOS 412 to the NMOS 416 and the ground node 462. The common-mode feedback circuit 440 adjusts the gate voltage of the NMOS 414 and the NMOS 416 to maintain the average voltage present at node 355 and node 360, respectively, at approximately VCM (e.g., by adjusting the gate voltage of the NMOS 414 and the NMOS 416 to control an amount of current flowing through each of the NMOS 414 and the NMOS 416, and thereby the path 380 and the path 385). In at least some examples, a value of a voltage present at node 446 moving higher with respect to node 448, causes the value of a signal present at node 355 to also move higher with respect to node 360 to maintain a positive output differential polarity between node 355 and node 360 while input differential polarity between node 442 and node 444 is positive.

In the second phase cycle in which CLK has a low value and nCLK has a high value, node 442 is coupled to the gate terminal of the PMOS 408 and node 444 is coupled to the gate terminal of the PMOS 406. Accordingly, during the second phase cycle, the voltage present at node 442 remains higher than the voltage present at node 444 (e.g., because the differential input remains a positive differential input) such that a value of the gate voltage of the PMOS 406 is less than the value of the gate voltage of the PMOS 408. The difference in values of the gate voltages of the PMOS 406 and the PMOS 408 causes a larger portion of a bias tail current to flow through PMOS 406 from current source 434 than the portion of the bias tail current flowing through PMOS 408. This greater proportion of the bias tail current flowing through PMOS 406 and lesser proportion of PMOS 408 creates an imbalanced condition at node 448 and node 446. The greater proportion of the bias tail current flowing through the PMOS 406 and lesser proportion of the bias tail current flowing through the PMOS 408 forces the voltage present at the node 448 to move higher and the voltage present at node 446 to move lower. In this second phase cycle, with CLK having a low value and nCLK having a high value, current path 390 and current path 395, shown in FIG. 3, facilitate the flow of the current flowing through the PMOS 430 from the node 350 and to the node 365 through the node 360 and the flow of the current flowing through the PMOS 432 from node 370 and to node 375 through node 355. The current flowing through the path 390 flows through the NMOS 410 to the NMOS 414 and the ground node 462. Similarly, the current flowing through the path 395 flows through the NMOS 412 to the NMOS 416 and the ground node 462. The common-mode feedback circuit 440 adjusts the gate voltage of the NMOS 414 and the NMOS 416 to maintain the average voltage present at node 360 and node 355, respectively, at approximately VCM (e.g., by adjusting the gate voltage of the NMOS 414 and the NMOS 416 to control an amount of current flowing through each of the NMOS 414 and the NMOS 416, and thereby the path 390 and the path 395). In at least some examples, a value of a voltage present at node 448 moving higher with respect to node 446 causes the value of a signal present at node 355 to also move higher with respect to node 360 to maintain a positive output differential polarity between node 355 and node 360 while input differential polarity between node 442 and node 444 is positive.

As can be seen from the above, the discussion of circuit 400 takes a positive differential input as an exemplary input that creates a positive differential output without regard to a phase of CLK. Similarly, in some examples the circuit 400 receives a negative differential input and creates a negative differential output without regard to a phase of CLK in a manner substantially similar to the above discussion considering a positive differential input. A detailed discussion of the example in which circuit 400 receives a negative differential input is not included herein for the sake of brevity, however such operations are contemplated by, and within the scope of, the present disclosure.

In the foregoing discussion, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device, element, or component couples to a second device, element, or component, that coupling is through a direct coupling or through an indirect coupling via other devices, elements, or components and connections. Similarly, a device, element, or component that is coupled between a first component or location and a second component or location is coupled through a direct connection or through an indirect connection via other devices, elements, or components and/or couplings. A device that is "configured to" perform a task or function is configured (e.g., programmed and/or hardwired) at a time of manufacturing by a manufacturer to perform the function and/or is configurable (or re-configurable) by a user after the time of manufacturing to perform the function and/or other additional or alternative functions. The configuring is through firmware and/or software programming of the device, through a construction and/or layout of hardware components and interconnections of the device, or through a combination thereof. Furthermore, some examples of a circuit or device that is said to include certain components is instead configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) instead, in some examples, includes only the semiconductor elements within a single physical device (e.g., a semiconductor die and/or IC package) and is configured to couple to at least some of the passive elements and/or the sources to form the described structure either at a time of manufacture or after a time of manufacture, for example, by an end-user and/or a third-party.

While certain components are described herein as being of a particular process technology (e.g., MOSFET, NMOS, PMOS, etc.), these components are, in some examples, interchangeable for components of other process technologies (e.g., replace MOSFET with bi-polar junction transistor (BJT), replace NMOS with PMOS or vice versa, etc.) and reconfiguring circuits including the replaced components to provide desired functionality at least partially similar to functionality available prior to the component replacement.

Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means +/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit, comprising:
a first p-type metal oxide semiconductor field effect transistor (PMOS) having a gate terminal configured to receive an inverse of a clock signal, a drain terminal coupled to a first node, and a source terminal coupled to a second node;
a second PMOS having a gate terminal configured to receive the clock signal, a drain terminal coupled to a third node, and a source terminal coupled to the second node;
a third PMOS having a gate terminal configured to receive the clock signal, a drain terminal coupled to the first node, and a source terminal coupled to a fourth node;
a fourth PMOS having a gate terminal configured to receive the inverse of the clock signal, a drain terminal coupled to the third node, and a source terminal coupled to the fourth node;
a first n-type metal oxide semiconductor field effect transistor (NMOS) having a gate terminal configured to receive the clock signal, a drain terminal coupled to the first node, and a source terminal coupled to a fifth node;
a second NMOS having a gate terminal configured to receive the inverse of the clock signal, a drain terminal coupled to the third node, and a source terminal coupled to the fifth node;
a third NMOS having a gate terminal configured to receive the inverse of the clock signal, a drain terminal coupled to the first node, and a source terminal coupled to a sixth node; and
a fourth NMOS having a gate terminal configured to receive the clock signal, a drain terminal coupled to the third node, and a source terminal coupled to the sixth node.

2. The circuit of claim 1, further comprising an amplifier having outputs coupled to seventh and eighth nodes.

3. The circuit of claim 2, further comprising an input chopper coupled between a first input node, a second input node, and the amplifier.

4. The circuit of claim 2, further comprising a fifth NMOS coupled between the fifth node and the seventh node and a sixth NMOS coupled between the sixth node and the eighth node.

5. The circuit of claim 4, further comprising a seventh NMOS coupled between the seventh node and a ground voltage potential and an eighth NMOS coupled between the eighth node and the ground voltage potential.

6. The circuit of claim 1, wherein the circuit is a front stage of a chopper amplifier, and wherein the first node and the third node are outputs of the front stage of the chopper amplifier.

7. The circuit of claim 1, wherein the second node and the fourth node are each configured to couple to a voltage supply.

8. A circuit, comprising:
an input chopper configured to receive an input signal;
a differential amplifier having an input coupled to an output of the input chopper;
a current mode chopping circuit coupled to an output of the differential amplifier; and
a first current mirror bias transistor pair coupled between a voltage supply and the current mode chopping circuit;
wherein the current mode chopping circuit comprises:
a first p-type metal oxide semiconductor field effect transistor (PMOS) having a gate terminal configured to receive an inverse of a clock signal, a drain terminal coupled to a first node, and a source terminal coupled to a second node;
a second PMOS having a gate terminal configured to receive the clock signal, a drain terminal coupled to a third node, and a source terminal coupled to the second node;
a third PMOS having a gate terminal configured to receive the clock signal, a drain terminal coupled to the first node, and a source terminal coupled to a fourth node;
a fourth PMOS having a gate terminal configured to receive the inverse of the clock signal, a drain terminal coupled to the third node, and a source terminal coupled to the fourth node;
a first n-type metal oxide semiconductor field effect transistor (NMOS) having a gate terminal configured to receive the clock signal, a drain terminal coupled to the first node, and a source terminal coupled to a fifth node;
a second NMOS having a gate terminal configured to receive the inverse of the clock signal, a drain terminal coupled to the third node, and a source terminal coupled to the fifth node;
a third NMOS having a gate terminal configured to receive the inverse of the clock signal, a drain terminal coupled to the first node, and a source terminal coupled to a sixth node; and
a fourth NMOS having a gate terminal configured to receive the clock signal, a drain terminal coupled to the third node, and a source terminal coupled to the sixth node.

9. The circuit of claim 8, further comprising:
a fifth NMOS coupled between the fifth node and a seventh node;
a sixth NMOS coupled between the sixth node and an eighth node;
a seventh NMOS coupled between the seventh node and a ground voltage potential; and
an eighth NMOS coupled between the eighth node and the ground voltage potential, wherein a first output of the first amplifier is coupled to the seventh node, and wherein a second output of the first amplifier is coupled to the eighth node.

10. The circuit of claim 9, further comprising a common-mode feedback circuit coupled between the first node, the third node, and gate terminals of the seventh NMOS and the eighth NMOS.

11. A circuit, comprising:
a first stage comprising an input chopper circuit, a first amplifier, and a current mode chopper circuit;
a second stage comprising a second amplifier;
a third stage comprising a third amplifier; and
a feed-forward path comprising a fourth amplifier;

wherein the current mode chopper circuit comprises:

a first p-type metal oxide semiconductor field effect transistor (PMOS) having a gate terminal configured to receive an inverse of a clock signal, a drain terminal coupled to a first node, and a source terminal coupled to a second node;

a second PMOS having a gate terminal configured to receive the clock signal, a drain terminal coupled to a third node, and a source terminal coupled to the second node;

a third PMOS having a gate terminal configured to receive the clock signal, a drain terminal coupled to the first node, and a source terminal coupled to a fourth node;

a fourth PMOS having a gate terminal configured to receive the inverse of the clock signal, a drain terminal coupled to the third node, and a source terminal coupled to the fourth node;

a first n-type metal oxide semiconductor field effect transistor (NMOS) having a gate terminal configured to receive the clock signal, a drain terminal coupled to the first node, and a source terminal coupled to a fifth node;

a second NMOS having a gate terminal configured to receive the inverse of the clock signal, a drain terminal coupled to the third node, and a source terminal coupled to the fifth node;

a third NMOS having a gate terminal configured to receive the inverse of the clock signal, a drain terminal coupled to the first node, and a source terminal coupled to a sixth node; and a fourth NMOS having a gate terminal configured to receive the clock signal, a drain terminal coupled to the third node, and a source terminal coupled to the sixth node.

12. The circuit of claim 11, wherein the second stage further comprises a notch filter.

13. The circuit of claim 12, wherein a first input of the notch filter is coupled to the first node and wherein a second input of the notch filter is coupled to the third node.

14. The circuit of claim 11, further comprising:

a fifth NMOS coupled between the fifth node and a seventh node;

a sixth NMOS coupled between the sixth node and an eighth node;

a seventh NMOS coupled between the seventh node and a ground voltage potential; and an eighth NMOS coupled between the eighth NMOS and the ground voltage potential, wherein a first output of the first amplifier is coupled to the seventh node, and wherein a second output of the first amplifier is coupled to the eighth node.

15. The circuit of claim 14, wherein the second node and the fourth node are each coupled to a voltage supply.

* * * * *